(12) United States Patent
Kimura

(10) Patent No.: US 8,216,668 B2
(45) Date of Patent: Jul. 10, 2012

(54) RESIN COMPOSITION, INSULATING SHEET WITH BASE, PREPREG, MULTILAYER PRINTED WIRING BOARD AND SEMICONDUCTOR DEVICE

(75) Inventor: Michio Kimura, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 0 days.

(21) Appl. No.: 12/443,822

(22) PCT Filed: Oct. 2, 2007

(86) PCT No.: PCT/JP2007/069303
§ 371 (c)(1),
(2), (4) Date: Mar. 31, 2009

(87) PCT Pub. No.: WO2008/044552
PCT Pub. Date: Apr. 17, 2008

(65) Prior Publication Data
US 2010/0065315 A1    Mar. 18, 2010

(30) Foreign Application Priority Data
Oct. 6, 2006    (JP) ................................. 2006-274666

(51) Int. Cl.
*B32B 3/00*    (2006.01)
(52) U.S. Cl. ..................... 428/325; 428/209; 428/297.4; 428/320.2; 428/327; 428/355 EP; 174/258; 174/259
(58) Field of Classification Search .......... 174/250–255, 174/258, 259; 428/209, 297, 320.2, 325, 428/327, 355 EP
See application file for complete search history.

(56) References Cited

U.S. PATENT DOCUMENTS

| | | | | |
|---|---|---|---|---|
| 5,368,921 | A * | 11/1994 | Ishii et al. ..................... | 442/232 |
| 6,133,377 | A * | 10/2000 | Nakamura et al. ............ | 525/109 |
| 6,376,053 | B1 * | 4/2002 | Nakamura et al. ............ | 428/209 |
| 6,403,221 | B1 * | 6/2002 | Nakamura et al. ............ | 428/416 |
| 6,805,958 | B2 * | 10/2004 | Nakamura et al. ............ | 428/416 |
| 6,881,293 | B2 * | 4/2005 | Nakamura et al. ......... | 156/307.1 |
| 7,179,552 | B2 * | 2/2007 | Nakamura et al. ......... | 428/297.4 |
| 7,208,062 | B2 * | 4/2007 | Nakamura et al. ............ | 156/153 |
| 7,342,053 | B2 * | 3/2008 | Nakamura .................... | 522/174 |

FOREIGN PATENT DOCUMENTS

| | | |
|---|---|---|
| JP | 07-106767 | 4/1995 |
| JP | 11-1547 | 1/1999 |
| JP | 11-87927 | 3/1999 |
| JP | 2001-181375 | 7/2001 |
| JP | 2002-241473 | 8/2002 |
| JP | 2005-154727 | 6/2005 |
| JP | 2005-240019 | 9/2005 |
| JP | 2005-285540 | 10/2005 |
| WO | WO 03/047324 | 6/2003 |
| WO | WO 2005/092945 | 10/2005 |

* cited by examiner

*Primary Examiner* — Cathy Lam
(74) *Attorney, Agent, or Firm* — Ditthavong Mori & Steiner, P.C.

(57) ABSTRACT

The present invention provides a resin composition which can produce a multilayer printed wiring board not causing peeling and crack in a thermal shock test such as a cooling/heating cycle, and having high heat resistance and low-thermal expansion characteristics, when the resin composition is used for an insulating layer of the multilayer printed wiring board; and also an insulating sheet provided on a base, a prepreg, a multilayer printed wiring board and a semiconductor device using thereof. The resin composition is used for forming an insulating layer of the multilayer printed wiring board, wherein a surface roughness parameter Rvk value of the insulating layer is from 0.1 μm to 0.8 μm, measured after the insulating layer being formed with the resin composition, and subject to roughening treatment.

14 Claims, No Drawings

RESIN COMPOSITION, INSULATING SHEET WITH BASE, PREPREG, MULTILAYER PRINTED WIRING BOARD AND SEMICONDUCTOR DEVICE

TECHNICAL FIELD

The present invention relates to a resin composition, an insulating sheet provided on abase, a prepreg, a multilayer printed wiring board and a semiconductor device.

BACKGROUND ART

In recent years, with growing demand of higher function of electronics, high-density integration within electronic components and high-density mounting of electronic components have been developed. Printed wiring boards capable of high-density mounting and so on used for the electronic components have been developed in miniaturization and high density than ever before. In order to increase the density in the printed wiring boards, buildup multilayer printed wiring boards have been widely employed (for example, see Japanese Patent Application Laid-open (JP-A) No. H07-106767).

Buildup multilayer printed wiring boards are generally produced by laminating insulating layers and conducting circuit layers, the insulating layer having a thickness of 100 μm or less and being constituted with a resin composition. Examples of a method for connecting the conducting circuit layers are methods of forming via holes by a laser method, a photo method or the like, having replaced a drill process used conventionally. In these methods, via holes having small diameter are disposed on conducting circuit layers without restriction. Thereby, these methods can increase density in printed wiring board. Various interlayer insulation materials for buildup produced by these methods are proposed.

In order to increase density in printed wiring board, formation of microscopic circuit is required. A semi-additive process has been widely known as technique to increase the density. The semi-additive process includes the steps of: coating a surface of a circuit pattern of an inner layer circuit board with an insulating layer formed with an insulating resin; subjecting a surface of the insulating layer to roughening treatment; subjecting the surface to electroless plating treatment to form a base; protecting non-circuit forming parts by plating resist; subjecting circuit forming parts to electroplating to thickly deposit copper on the circuit forming parts; and performing resist removal and soft etching to form a conducting circuit on the insulating layer.

In such a semi-additive process, it is not preferable if concavity and convexity of a surface (degree of surface roughness) of the insulating layer are too large after the roughening treatment, since delay in speed of electric current passing a surface of copper, and decrease of hygroscopic solder heat resistance (solder heat resistance after applying hygroscopic environmental stress), may be caused. However, if the degree of surface roughness of the insulating layer is reduced, adhesion between plated metal and the insulating layer decreases. Thereby, defects such as expansion of plated metal, peeling in thermal shock tests including a cooling/heating cycle, and so on may be easily caused.

SUMMARY OF INVENTION

Technical Problem

The present invention provides a resin composition which can produce a multilayer printed wiring board having flame resistance in addition to high adhesion, high heat resistance and low-thermal expansion characteristics, and being capable of forming a microscopic circuit with high density, when the resin composition is used for an insulating layer of the multilayer printed wiring board. The present invention also provides an insulating sheet provided on a base, a prepreg, a multilayer printed wiring board, and a semiconductor device using the resin composition.

Solution to Problem

The above objects can be attained by the following [1] to [16].

[1] A resin composition used for forming an insulating layer of a multilayer printed wiring board, wherein a surface roughness parameter Rvk value of the insulating layer is from 0.1 μm to 0.8 μm, measured after the insulating layer being formed with the resin composition, and subjected to roughening treatment.

[2] The resin composition according to [1] comprising an inorganic filler having an average particle diameter from 0.01 μm to 0.45 μm.

[3] The resin composition according to [2], wherein a specific surface area of the inorganic filler is from 8 $m^2/g$ to 200 $m^2/g$.

[4] The resin composition according to [2] or [3], wherein the inorganic filler is a spherical silica.

[5] The resin composition according to any of [2] to [4] 4, wherein a charging amount of the inorganic filler is from 20 weight % to 80 weight %.

[6] The resin composition according to any of [1] to [5], comprising one or more kinds of silane coupling agents selected from an epoxy silane coupling agent, an amino phenyl silane coupling agent, an amino silane coupling agent, a mercaptosilane coupling agent and a vinyl silane coupling agent.

[7] The resin composition according to any of [1] to [6], comprising one or more kinds of epoxy resins having a molecular weight of 5,000 or less.

[8] The resin composition according to any of [1] to [7], comprising one or more kinds of phenoxy resins having a molecular weight of 5,000 or more.

[9] The resin composition according to any of [1] to [8], comprising a cyanate resin and/or a prepolymer thereof.

[10] The resin composition according to any of [1] to [9], comprising an imidazole compound as a curing accelerator.

[11] An insulating sheet provided on a base, wherein a resin composition defined by any of [1] to [10] is carried on the base.

[12] A prepreg comprising a fiber base material impregnated with a resin composition defined by any of [1] to [10].

[13] A multilayer printed wiring board comprising an inner layer circuit board and an insulating layer, wherein the insulating layer is provided on one side or both sides of the inner layer circuit board, and the insulating layer is made of a cured product of a resin composition defined by any of Claims 1 to 10.

[14] A multilayer printed wiring board comprising an inner layer circuit board and an insulating layer, wherein the insulating layer is provided on one side or both sides of the inner layer circuit board, and the insulating layer is made of a cured product of a prepreg, which is a fiber base material impregnated with a resin composition defined by any of [1] to [10].

[15] The multilayer printed wiring board according to [13] or [14], wherein a surface roughness parameter Rvk value of the insulating layer is from 0.1 μm to 0.8 μm.

[16] A semiconductor device comprising a multilayer printed wiring board defined by any of [13] to [15] used as a substrate for a package.

Advantageous Effects of Invention

The resin composition of the present invention is used for forming an insulating layer of a multilayer printed wiring board, wherein a surface roughness parameter Rvk value of the insulating layer is from 0.1 μm to 0.8 μm, measured after the insulating layer being formed with the resin composition, and subjected to roughening treatment.

By using the resin composition of the present invention for an insulating layer of a multilayer printed wiring board, a multilayer printed wiring board, having flame resistance in addition to high adhesion, high heat resistance and low-thermal expansion characteristics, and being capable of forming a microscopic circuit with high density, can be produced.

DESCRIPTION OF EMBODIMENTS

Hereinafter, a resin composition, an insulating sheet provided on a base, a prepreg, a multilayer printed wiring board and a semiconductor device of the present invention will be described in detail.

A resin composition of the present invention is a resin composition used for forming an insulating layer of a multilayer printed wiring board, wherein a surface roughness parameter Rvk value of the insulating layer is from 0.1 μm to 0.8 μm, measured after the insulating layer being formed with the resin composition, and subjected to roughening treatment.

An insulating sheet provided on a base of the present invention is constituted with the base and the resin composition of the present invention carried on the base.

A prepreg of the present invention comprises a fiber base material impregnated with the resin composition of the present invention.

A multilayer printed wiring board of the present invention is formed by layering the insulating sheet on the base of the present invention or the prepreg of the present invention on one side or both sides of an inner layer circuit board, and subjecting to hot press molding.

A semiconductor device of the present invention uses the multilayer printed wiring board of the present invention as a substrate for a package.

Firstly, the resin composition of the present invention will be described. A loading rate of each component contained in the resin composition is a ratio on the basis of solid content as a total amount (100 weight %). The solid content refers to all components except a solvent. Liquid components which are not the solvent are included in the solid content.

In the resin composition of the present invention, a surface roughness parameter Rvk value of an insulating layer is from 0.1 μm to 0.8 μm, measured after the insulating layer being formed with the resin composition, and subjected to roughening treatment. The Rvk value is more preferably from 0.15 μm to 0.6 μm, most preferably from 0.2 μm to 0.5 μm. Herein, the surface roughness parameter Rvk value, measured after the insulating layer being formed with the resin composition, and subjected to roughening treatment, is determined by particle characteristics of inorganic fillers contained in the resin composition, a type and compounding amount of resin contained in the resin composition, a condition of the roughening treatment and so on. Therefore, by controlling these conditions, the Rvk value can be in the above range.

The surface roughness parameter Rvk can be measured by means of WYKO NT1100 manufactured by Veeco. Rvk refers to "reduced valley depth" defined in JIS B0671-2:2002 (ISO 13565-2:1996) as an average reduced valley depth shown under a roughness core profile. As a parameter indicating surface roughness, Ra (arithmetic average roughness) is well known. However, since Ra is an arithmetic average of roughness, it is difficult to relate Ra to actual material characteristics. In order to compare shapes of insulating layers being formed with a resin composition for a multilayer printed board, and subjected to roughening, Rvk is most suitable.

It is not preferable if the Rvk exceeds the above upper limit, since delay in speed of electric current passing a surface of copper and decrease of hygroscopic solder heat resistance may be caused. It is not preferable if the Rvk is less than the above lower limit, since sufficient adhesion between plated metal and an insulating layer cannot be obtained.

The resin composition of the present invention preferably contains an inorganic filler having an average particle diameter from 0.01 μm to 0.45 μm, more preferably from 0.1 μm to 0.4 μm. It is not preferable if the average particle diameter exceeds the above upper limit, since particles are so large that the surface roughness after roughening treatment can be too large. If the average particle diameter is less than the above lower limit, it is difficult to disperse and stabilize particles in the resin composition, since particles are too small.

The average particle diameter refers to a median diameter based on volume, and can be measured by the laser diffraction and scattering method.

The inorganic filler preferably has a specific surface area from $8 \text{ m}^2/\text{g}$ to $200 \text{ m}^2/\text{g}$, more preferably from $10 \text{ m}^2/\text{g}$ to $50 \text{ m}^2/\text{g}$. It is not preferable if the specific surface area exceeds the above upper limit, since inorganic fillers easily aggregate and a structure of the resin composition becomes unstable. It is not preferable if the specific surface area is less than the above lower limit, since such inorganic fillers are less suitable to be filled in the resin composition.

The specific surface area refers to a BET specific surface area, and can be measured by the gas adsorption method (BET method).

The inorganic filler is preferably silica, more preferably fused silica. Fused silica is excellent in low expansion properties compared to other inorganic fillers.

Examples of shapes of silica are a crushed shape and a spherical shape. A spherical silica is preferable since a large amount of inorganic filler can be charged in the resin composition maintaining excellent flowability. In the resin composition of the present invention, other inorganic fillers such as talc, alumina, glass, mica and aluminum hydroxide can be contained, if necessary.

The inorganic filler is preferably contained in the resin composition of the present invention at a rate from 20 weight % to 80 weight %, more preferably from 25 weight % to 70 weight %, most preferably from 30 weight % to 60 weight %. It is not preferable if the charging amount of the inorganic filler exceeds the above upper limit, since the flowability of the resin composition becomes extremely low. It is not preferable if the charging amount of the inorganic filler is less than the above lower limit, since the resin composition may not be able to form sufficiently strong insulating layer.

The resin composition of the present invention preferably contains one or more kinds of silane coupling agents selected from an epoxy silane coupling agent, an amino phenyl silane coupling agent, an amino silane coupling agent, a mercaptosilane coupling agent and a vinyl silane coupling agent. Thereby, adhesion between the resin component and the inorganic filler or a wiring metal can be improved, and reliability of the resin composition can be improved.

The charging amount of the coupling agent is not particularly limited, but is preferably from 0.05 parts by weight to 5 parts by weight, more preferably from 0.1 parts by weight to 2 parts by weight, with respect to 100 parts by weight of the inorganic filler.

It is not preferable if the charging amount of the coupling agent exceeds the above upper limit, since crack is easily caused in the resin composition. If the charging amount is less than the above lower limit, the effect of improving adhesion between the resin component and the inorganic filler or a wiring metal may not be sufficiently obtained.

The resin composition of the present invention preferably contains one or more kinds of epoxy resins having a molecular weight of 5,000 or less. Thereby, heat resistance and poor pyrolysis property can be imparted. Also, film-forming property when the insulating sheet on a base is produced and adhesion to an inner layer circuit board when a multilayer printed wiring board is produced can be improved.

The epoxy resin used in the resin composition of the present invention is not particularly limited. Examples of the epoxy resins are phenol novolac type epoxy resins, bisphenol type epoxy resins, naphthalene type epoxy resins and arylalkylene type epoxy resin. Among the above, the arylalkylene type epoxy resins are preferable. By using such epoxy resins, flame resistance and hygroscopic solder heat resistance can be improved.

Herein, the term "arylalkylene type epoxy resins" means epoxy resins having one or more arylalkylene groups in a repeating unit, for example, there may be xylylene type epoxy resins and biphenyl dimethylene type epoxy resins. Among the above, the biphenyl dimethylene type epoxy resins are preferable. By using such epoxy resins, flame resistance can be further improved.

For example, the biphenyldimethylene type epoxy resin, represented by the following formula (I), can be used.

is not preferable if the weight-average molecular weight exceeds the above upper limit, since flowability of the epoxy resin may decrease and formability may decline. By having the molecular weight of the epoxy resin within the above range, it is possible to take an excellent balance of the above properties.

The charging amount of the epoxy resin is not particularly limited, but is preferably from 5 to 50 weight %, more preferably from 10 to 40 weight %, with respect to the total amount of the resin composition.

If the charging amount of the epoxy resin is less than the above lower limit, the effect of improving hygroscopic solder heat resistance and adhesion may be reduced. It is not preferable if the charging amount of the epoxy resin exceeds the above upper limit, since dispersibility of the inorganic filler may lower. By having the charging amount of the epoxy resin within the above range, it is possible to take an excellent balance of the above properties.

The resin composition of the present invention preferably contains one or more kinds of phenoxy resins having a molecular weight of 5,000 or more. Thereby, film-forming property when the insulating sheet on a base is produced can be further improved.

The phenoxy resin is not particularly limited. Examples of the phenoxy resin are phenoxy resins having bisphenol skeleton, phenoxy resins having novolac skeleton, phenoxy resins having anthracene skeleton, phenoxy resins having fluorene skeleton, phenoxy resins having dicyclopentadiene skeleton, phenoxy resins having norbornene skeleton, phenoxy resins having naphthalene skeleton, phenoxy resins having biphenyl skeleton and phenoxy resins having adamantane skeletons.

Examples of the phenoxy resins having bisphenol skeleton are phenoxy resins having bisphenol A skeleton, phenoxy resins having bisphenol F skeleton, phenoxy resins having bisphenol S skeleton, phenoxy resins having bisphenol M skeleton, phenoxy resins having bisphenol P skeleton and phenoxy resins having bisphenol Z skeleton.

As the phenoxy resin, phenoxy resins with a structure having several kinds of skeletons selected from the above can

[Chemical formula 1]

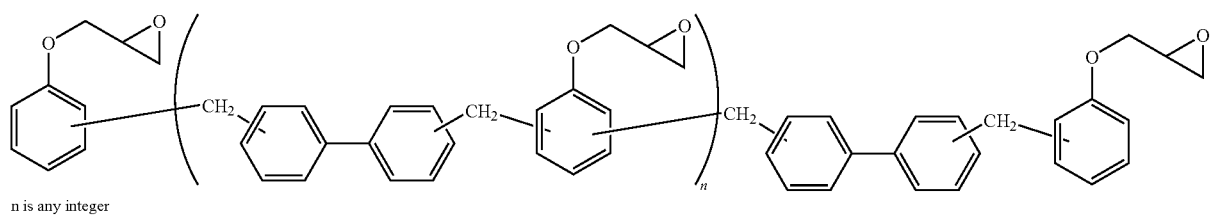

(I)

n is any integer

"n" of the biphenyl dimethylene type epoxy resin represented by the above formula (I) is not particularly limited, but 0 to 10 is preferable, 0 to 2 is particularly preferable.

It is not preferable if the number of "n" is more than the above range, since flowability of the epoxy resin may be decreased and formability may be decreased.

The weight-average molecular weight of the epoxy resin is preferably 5,000 or less, more preferably from 500 to 4,000, particularly preferably from 800 to 3,000.

If the weight-average molecular weight is less than the above lower limit, tackiness may be exhibited on a surface of an insulating resin layer and handling may decline when producing the insulating sheet on a base. On the other hand, it be used, and phenoxy resins in which a ratio of skeletons is different can be used. Further, several kinds of phenoxy resins having different skeletons may be used. Several kinds of phenoxy resins having different weight-average molecular weights and prepolymers thereof may also be used together.

Among the above, the phenoxy resins having biphenyl skeleton and bisphenol S skeleton can be used. Thereby, the rigidity of the biphenyl skeleton can raise a glass transition temperature, and the bisphenol S skeleton can improve the adhesive property of the resin composition with plated metal when a multilayer printed wiring board is produced.

In addition, phenoxy resins having bisphenol A skeleton and bisphenol F skeleton can be used. Thereby, adhesion of the resin composition to the inner layer circuit board when a multilayer printed wiring board is produced can be improved.

Further, the phenoxy resins having biphenyl skeleton and bisphenol S skeleton and phenoxy resins having bisphenol A skeleton and bisphenol F skeleton may be used together.

The molecular weight of the phenoxy resin is not particularly limited, but is preferably from 5,000 to 70,000, more preferably from 10,000 to 60,000.

If the weight-average molecular weight of the phenoxy resin is less than the above lower limit, the effect of improving film-forming property may be insufficient. On the other hand, if the weight-average molecular weight of the phenoxy resin exceeds the above upper limit, solubility of the phenoxy resin may be reduced. By having the weight-average molecular weight of the phenoxy resin within the above range, it is possible to take an excellent balance of the above properties.

The charging amount of the phenoxy resin is not particularly limited, but is preferably from 1 to 40 weight %, more preferably from 5 to 30 weight %, with respect to the total amount of the resin composition.

If the charging amount of the phenoxy resin is less than the above lower limit, the effect of improving film-forming property may be insufficient. On the other hand, if the charging amount of the phenoxy resin exceeds the above upper limit, the effect of imparting low-thermal expansion characteristics may be decreased since the charging amount of a cyanate resin becomes relatively low. By having the charging amount of the phenoxy resin within the above range, it is possible to take an excellent balance of the above properties.

It is preferable that both epoxy resin and phenoxy resin used in the composition of the present invention substantially contain no halogen atom. Thereby, flame resistance can be imparted without using halogen compounds.

Herein, "substantially contain no halogen atom" means, for example, the charging amount of halogen atom in the epoxy resin or phenoxy resin is 1 weight % or less.

The resin composition of the present invention preferably contains a cyanate resin and/or a prepolymer thereof. Thereby, flame resistance of the resin composition can be improved.

A method of obtaining the cyanate resin and/or the prepolymer thereof is not particularly limited. An example of the method is: reacting a cyanogen halide compound with phenols; and prepolymerizing them by heating or the like, if necessary. Also, commercial products prepared by the above method may be used.

A type of cyanate resin is not particularly limited. Examples of the cyanate resin are bisphenol type cyanate resins such as novolac type cyanate resins, bisphenol A type cyanate resins, bisphenol E type cyanate resins and tetramethyl bisphenol F type cyanate resins.

Among the above, the novolac type cyanate resins are preferable. Thereby, heat resistance can be improved by increase of cross-linking density, and flame resistance can be further improved. The reason is considered that novolac type cyanate resins have high ratio of benzene ring because of its structure and are easily carbonized.

The novolac type cyanate resins can be obtained by reacting, for example, a novolac type phenol resin with compounds such as cyanogen chloride and cyanogen bromide. Also, commercial products prepared by the above method can be used.

Herein, the novolac type cyanate resin, for example, represented by the following formula (II) can be used.

[Chemical formula 2]

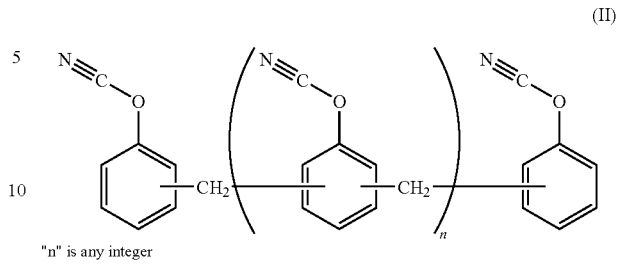

"n" is any integer

The weight-average molecular weight of the novolac type cyanate resin represented by the above formula (II) is not particularly limited, but is preferably from 500 to 4,500, more preferably from 600 to 3,000.

If the weight-average molecular weight is less than the above lower limit, mechanical strength may decline. If the weight-average molecular weight exceeds the above upper limit, shelf stability may decline since hardening rate of the resin composition increases.

As the cyanate resin, a prepolymerized cyanate resin thereof can be used.

Herein, the "prepolymer" is generally obtained by, for example, trimerizing the cyanate resin by a heating reaction or the like, and is preferably used for adjusting formability and flowability of the resin composition.

Herein, the prepolymer is not particularly limited. For example, a prepolymer having a rate of trimerization from 20 to 50 weight % can be used. The rate of trimerization can be determined, for example, by means of infrared spectroscopic analysis devices.

The novolac type cyanate resin can be used alone, two or more kinds of novolac type cyanate resins having different weight-average molecular weights can be used together, or one or more kinds of novolac type cyanate resins and a prepolymer thereof can be used together.

In the composition of the present invention, the charging amount of the cyanate resin is not particularly limited, but is preferably from 5 to 50 weight %, more preferably from 10 to 40 weight %, with respect to the total amount of the resin composition. Thereby, improvement of heat resistance and flame resistance due to the cyanate resin can be more effectively exhibited.

If the charging amount of the cyanate resin is less than the above lower limit, the effect of improving heat resistance may decline. If the charging amount of the cyanate resin exceeds the above upper limit, humidity resistance may decline since the cross-linking density may increase and free volume may increase.

The resin composition of the present invention preferably contains an imidazole compound as a curing accelerator. An imidazole compound which is compatible with resin components contained in the resin composition is more preferable. By using such an imidazole compound, the reaction of the cyanate resin or the epoxy resin can be effectively promoted. Also, equivalent properties can be imparted even by reducing the compounding amount of the imidazole compound.

Further, the resin composition using such an imidazole compound can be cured with high uniformity due to a microscopic matrix unit between the imidazole compound and resin components. Thereby, insulating property and heat resistance of resin layers formed in a multilayer printed wiring board can be improved.

Examples of the imidazole compound used in the resin composition of the present invention are 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino-6-(2'-undecylimidazolyl)-ethyl-s-triazine, and 2,4-diamino-6-[2'-ethyl-4-methylimidazolyl-(1')]-ethyl-s-triazine.

Among the above, the imidazole compound selected from 1-benzyl-2-methylimidazole, 1-benzyl-2-phenylimidazole and 2-ethyl-4-methylimidazole is preferable. By using these imidazole compounds, it is possible to obtain a cured product having high uniformity, and to form fine and uniform roughening surface due to particularly excellent compatibility of the compounds. Hence, fine conducting circuits can be easily formed, and high heat resistance of a multilayer printed wiring board can be exhibited.

The charging amount of the imidazole compound is not particularly limited, but is preferably from 0.01 to 5 weight %, particularly preferably from 0.05 to 3 weight %, with respect to a total amount of the cyanate resin and epoxy resin. Thereby, heat resistance can be particularly improved.

The resin composition of the present invention may contain additives such as defoaming agents and leveling agents, if necessary, besides components mentioned above.

A preferable ratio, when the resin composition of the present invention contains the inorganic filler, the epoxy resin, the phenoxy resin and the cyanate resin are contained as main components, is the inorganic filler from 20 to 75 weight %, the epoxy resin from 10 to 20 weight %, the phenoxy resin from 5 to 25 weight % and the cyanate resin from 10 to 35 weight %.

A method of forming an insulating layer or an insulating film with the resin composition of the present invention will be explained in detail. For example, an insulating layer or an insulating film can be obtained as follows: the resin composition is dissolved and dispersed in a solvent or the like to prepare a resin varnish; the resin varnish is applied on a base by means of any coater and dried to produce an insulating sheet provided on the base; the insulating sheet side of the insulating sheet on the base and an inner layer circuit board are faced, and the insulating sheet on the base and the inner layer circuit board are subjected to hot press molding under vacuum by means of a vacuum pressurized laminating device or the like; and the insulating sheet on the base is cured by heating by means of a hot air drying machine or the like. The base of the insulating sheet on the base may be peeled before or after heat-curing.

The thickness of the insulating layer or insulating film constituted with the resin composition is not particularly limited, but is preferably from 10 to 100 μm, more preferably from 20 to 80 μm. The condition of hot press molding is not particularly limited. An example of the condition is a temperature from 60 to 160° C. and a pressure from 0.2 to 3 MPa. The condition of heat-curing is not particularly limited. The heat-curing may be performed at from 140 to 240° C. for 30 to 120 minutes.

A surface of the insulating resin layer formed with the resin composition of the present invention may be subjected to roughening treatment using, for example, oxidants such as permanganate and bichromate. Thereby, many fine concavo-convex shapes of high uniformity can be formed on the surface of the insulating layer after the roughening treatment.

Metal plating treatment may be performed on the surface of the insulating resin layer after the roughening treatment. Thereby, fine conducting circuits can be precisely formed since smoothness of the roughened surface can be high. Also, anchor effect can be increased by the fine concavo-convex shapes and high adhesion can be imparted between the insulating resin layer and the plating metal.

The roughening treatment will be explained in detail. The roughening treatment is preferably performed by dipping the insulating layer or insulating film formed with the resin composition of the present invention in a swelling agent made of an aqueous solution containing diethylene glycol monobutyl ether and sodium hydrate, and then in a roughening agent containing permanganate and sodium hydrate. Other solvents and additives may be added to the swelling agent and the roughening agent, if necessary. In addition, after dipping the insulating layer or insulating film in the roughening agent, neutralization by acid is preferably performed. If the neutralization is not performed, permanganate may not be sufficiently removed and heat generation and ignition may occur.

The roughening treatment is preferably carried out with the use of the swelling solution having a temperature from 50 to 90° C., more preferably from 65 to 80° C., and the roughening solution having a temperature from 60 to 90° C., more preferably from 70 to 85° C. It is not preferable if the temperature exceeds the above upper limit, since roughening may progress too much and desired surface roughness cannot be obtained. It is not preferable if the temperature is less than the above lower limit, since roughening may not progress sufficiently and adhesion with the plated metal may decrease.

In the roughening treatment, the time for dipping in the swelling agent is preferably from 3 to 20 minutes, more preferably from 5 to 15 minutes, and the time for dipping in the roughening agent is preferably from 3 to 40 minutes, more preferably from 5 to 25 minutes. It is not preferable if the time for dipping exceeds the above upper limit, since roughening may progress too much and desired surface roughness cannot be obtained. It is not preferable if the time for dipping is less than the above lower limit, since roughening may not progress sufficiently and adhesion with the plated metal may decrease.

The insulating layer or insulating film formed with the resin composition of the present invention preferably has a surface roughness parameter Rvk value from 0.1 μm to 0.8 μm in all ranges or most ranges of the above conditions of the roughening treatment. However, when the roughening treatment is performed under at least one condition of the roughening treatment, the surface roughness parameter Rvk value may be in the above range.

That is, the insulating layer or insulating film, obtained by forming the resin layer with the resin composition of the present invention and curing the resin layer by heating, may have the surface roughness parameter Rvk value from 0.1 μm to 0.8 μm measured after the roughening treatment under at least one condition in the following range.

<Roughening Treatment Process>

The insulating layer having a thickness of 10 to 100 μm is dipped in a swelling agent made of an aqueous solution containing 20 to 60 wt % of diethylene glycol monobutyl ether and 0.1 to 1.0 wt % of sodium hydrate and having a temperature from 50 to 90° C., for 3 to 20 minutes, and then in a roughening agent made of an aqueous solution containing 5.0 to 15.0 wt % of permanganate and 1.0 to 10.0 wt % of sodium hydrate and having a temperature from 60 to 90° C., for 3 to 40 minutes.

Herein, "the insulating layer has the surface roughness parameter Rvk value from 0.1 μm to 0.8 μm measured after the roughening treatment under at least one condition in the following range" means that the surface roughness parameter Rvk value in the range from 0.1 μm to 0.8 μm may be measured in one setting of conditions among ranges selectable from conditions contained in the above specified roughening treatment process.

In other words, when the insulating layer is formed with the resin composition having a specific composition and the insulating layer is subjected to the above roughening treatment, it is not necessary that Rvk value is in the range from 0.1 μm to 0.8 μm in all ranges of conditions of the roughening treatment. It is sufficient if Rvk value of the insulating layer is in the range from 0.1 μm to 0.8 μm when the roughening treatment is performed under at least one specific setting of conditions within the range of conditions of the roughening treatment.

Next, the insulating sheet provided on the base of the present invention will be explained.

The insulating sheet provided on the base of the present invention is constituted with the resin composition of the present invention carried on the base, and constituted with the insulating sheet formed with the resin composition and the base capable of carrying the above insulating sheet and transferring carrying insulating sheet on other surfaces.

A method of allowing the base to carry the resin composition is not particularly limited. Examples of the method are: a method including steps of dissolving and dispersing the resin composition in a solvent or the like to prepare a resin varnish, applying the resin vanish on the base by means of any coater, and then drying the varnish; and a method including steps of spraying a resin varnish on the base by means of a spray, and then drying the varnish.

Among the above, the method, including steps of applying the resin varnish on the base by means of any coater such as comma coaters and die coaters, and then drying the varnish, is preferable. Thereby, it is possible to efficiently produce the insulating sheet on the base, which is free from voids and has a uniform thickness.

A solvent used in preparation of the resin varnish is not particularly limited. Examples of the solvent which may be used are alcohols, ethers, acetals, ketones, esters, alcohol esters, ketone alcohols, ether alcohols, ketone ethers, ketone esters and ester ethers.

The solid content in the resin varnish is not particularly limited, but is preferably from 30 to 80 weight %, particularly preferably from 40 to 70 weight %.

In the insulating sheet on the base of the present invention, the thickness of the insulating sheet constituted with the resin composition is not particularly limited, but is preferably from 10 to 100 μm, more preferably from 20 to 80 μm. Thereby, when a multilayer printed wiring board is produced using the insulating sheet on the base, convexoconcaves of an inner circuit can be filled upon molding and suitable thickness of the insulating layer can be ensured. Also, in the insulating sheet on the base, cracks of the insulating sheet can be prevented and powder falling upon cutting can be reduced.

The base used in the insulating sheet on the base of the present invention is not particularly limited. Examples of the base which can be used are thermoplastic resin films having heat resistance such as polyester resins including polyethylene terephthalate and polybutylene terephthalate, fluorinated resins, polyimide resins or the like; and metal foil of copper and/or copper alloy, aluminum and/or aluminum alloy, iron and/or iron alloy, silver and/or silver alloy or the like.

The thickness of the base is not particularly limited, but is preferably 10 to 70 μm since handling upon producing the insulating sheet on the base may be excellent.

In the production of the insulating sheet on the base of the present invention, it is preferable that convexoconcaves on the surface of the base where the insulating sheet is to be bonded are as small as possible. Thereby, advantages of the present invention can be effectively exhibited.

Next, a prepreg of the present invention will be explained. A prepreg of the present invention is a fiber base material impregnated with the resin composition of the present invention.

The fiber base material used for the prepreg of the present invention is not particularly limited. Examples of the fiber base material are glass fiber base materials such as glass woven fabric and glass nonwoven fabric, inorganic fiber base materials such as woven or nonwoven fabric formed of inorganic compounds other than glass, and organic fiber base materials formed of organic fiber such as aromatic polyamide resins, polyamide resins, aromatic polyester resins, polyester resins, polyimide resins and fluorine resins.

Among the above fiber base materials, the glass fiber base materials represented by the glass woven fabric are preferable since mechanical strength is high and water absorption property is low.

Examples of methods for impregnating the fiber base material with the resin composition of the present invention are: a method including steps of dissolving and dispersing the resin composition in a solvent to prepare a resin varnish, and dipping the fiber base material in the resin varnish; a method including steps of applying a resin varnish on the fiber base material by means of any coater; and a method including steps of spraying a resin varnish on the fiber base material by means of a spray.

Among the above, the method including dipping the fiber base material in the resin varnish is preferable. Thereby, impregnation of the resin composition into the fiber base material can be improved.

When dipping the fiber base material in the resin varnish, general devices for impregnating coating may be used.

A solvent used for the resin varnish is not particularly limited. The solvent used for producing the insulating sheet on the base may be similarly used.

The solid content in the resin varnish is not particularly limited, but is preferably from 40 to 80 weight %, particularly preferably from 50 to 70 weight %. Thereby, the viscosity of the resin varnish can be suitable and impregnation of the resin varnish to the fiber base material can be further improved.

The prepreg of the present invention can be produced by impregnating the fiber base material with the resin varnish, adjusting the impregnation amount of the resin composition, if necessary, and then drying the fiber base material at a predetermined temperature, for example, from 80 to 200° C.

Next, a multilayer printed wiring board of the present invention will be explained.

A multilayer printed wiring board has conducting circuits laminated via the insulating layer formed on one side or both sides of an inner layer circuit board either by transferring the insulating sheet from the insulating sheet on the base of the present invention, or by laminating and curing the prepreg of the present invention.

In the case of using the insulating sheet on the base The multilayer printed wiring board is formed by layering the insulating sheet on the base on one side or both sides of the inner layer circuit board, and subjecting to hot press molding.

Specifically, the multilayer printed wiring board can be obtained by facing the insulation sheet side of the insulating sheet on the base and the inner layer circuit board; subjecting the insulating sheet on the base and the inner layer circuit board to hot press molding under vacuum by means of the vacuum pressurized laminating device or the like; peeling the base; and heat-curing the insulating sheet by means of a hot air drying machine or the like before or after peeling the base.

The condition of hot press molding is not particularly limited. An example of the condition is temperature from 60 to 160° C. and pressure from 0.2 to 3 MPa. The condition of heat-curing is not particularly limited. An example of the condition is temperature from 140 to 240° C. and time of 30 to 120 minutes.

Alternatively, the multilayer printed wiring board can be obtained by facing the insulating sheet side of the insulating sheet on the base of the present invention and the inner layer circuit board, subjecting the insulating sheet on the base and the inner layer circuit board to hot press molding by means of plate press machine or the like. The condition of hot press molding is not particularly limited. An example of the condition is temperature from 140 to 240° C. and pressure from 1 to 4 MPa.

As the inner layer circuit board used for the multilayer printed wiring board, for example, an inner layer circuit board, produced by forming predetermined conducting circuits on both sides of a copper-clad laminate by etching or the like, and subjecting conducting circuit parts to black oxide treatment, may be suitably used.

In the multilayer printed wiring board obtained by the above, the base may be peeled and removed to expose the insulating layer, that is, the insulating layer formed by laminating and bonding the insulating sheet on the inner layer circuit board; the surface of the insulating layer may be subjected to the roughening treatment using oxidants such as permanganate and bichromate; and then a new conducting wiring circuit may be formed by metal plating. On the insulating layer formed with the resin composition of the present invention, many fine concavo-convex shapes of high uniformity can be formed in the roughening treatment, and also fine wiring circuits can be precisely formed since smoothness of the surface of the insulating layer can be high.

In the case of using the prepreg, the multilayer printed wiring board is formed by layering the prepreg on one side or both sides of the inner layer circuit board, and subjecting to hot press molding.

Specifically, the insulating layer may be formed by layering the prepreg on the surface of the inner layer circuit and subjecting to hot press molding. After the surface of the insulating layer is subjected to the roughening treatment using oxidants such as permanganate and bichromate, a new conducting wiring circuit can be formed by metal plating. This method is based on the so-called semi-additive method including lamination of the insulating layer and the metal plating of pattern shape.

In the case of using the prepreg, a non-pattern conducting layer may be provided on the insulating layer made from the prepreg, and etched into a predetermined circuit pattern so that conducting circuits are formed by a method based on the so-called subtractive method.

For example, a copper foil layer is formed by layering a single-sided copper-clad laminate or a copper foil itself on the circuit pattern of the inner layer circuit board so that the copper foil layer is disposed on the outer side, via the insulating layer made of the prepreg, and subjecting to hot press molding. After protecting a circuit-forming part of the copper foil layer by resist, conducing circuits are formed on the insulating layer by etching. Alternatively, two single-sided copper-clad laminates or two double-sided copper-clad laminates may be laminated and bonded via the insulating layer made of the prepreg, so that the non-pattern copper foil layer is disposed on the outer side, and then conducting circuits are formed on the insulating layer by etching the copper foil layer. In this case, the copper foil layer which is disposed on the inner side of a laminated body is preliminarily formed in pattern form of conducting circuits.

Further, the prepreg may be used as a base of the inner layer circuit board. In this case, a single-sided or double-sided copper-clad laminate is formed by layering a copper foil on one or both sides of the prepreg, and subjecting to hot press molding. After protecting a circuit-forming part of a copper foil layer by resist, inner layer circuits are formed by etching.

Then, the insulating layer and conducting circuits are formed on the inner layer circuit board produced by the prepreg of the present invention, using the insulating sheet on the base or the prepreg. Thus, the multilayer printed wiring board can be obtained.

According to the present invention, as mentioned above, the multilayer printed wiring board provided with the insulating layer made of the cured product of the resin composition of the present invention or the cured product of the prepreg, which is formed by impregnating the fiber base material with the resin composition of the present invention, disposed on one or both sides of the inner layer circuit board, can be obtained. The surface roughness parameter Rvk value of the insulating layer formed on the inner layer circuit board can be adjusted in the range from 0.1 μm to 0.8 μm by performing the above roughening treatment. Hence, the conducting circuit made of plated metal can be formed with excellent adhesion, and there is little problem such as delay of current speed and decrease of hygroscopic heat resistance, which are caused when the surface roughness of the insulating layer is too large.

Next, a semiconductor device using the multilayer printed wiring board of the present invention will be explained.

The semiconductor device is produced by mounting semiconductor chips on the multilayer printed wiring board and encapsulating the board by an encapsulating resin. Methods for mounting and encapsulating semiconductor chips are not particularly limited. By using the multilayer printed wiring board of the present invention as a substrate for a packaging, a semiconductor device capable of high-density mounting and excellent in reliability can be produced.

EXAMPLES

The present invention will be hereinafter explained in detail with reference to Examples and Comparative examples.

In Examples and Comparative examples, the materials used are as follows.

(1) Inorganic filler A (spherical fused silica; trade name: SO-C1, manufactured by Admatechs Company Limited; average particle diameter: 0.3 μm; specific surface area: 17 m$^2$/g)

(2) Inorganic filler B (spherical fused silica; trade name: SO-25H, manufactured by Admatechs Company Limited; average particle diameter: 0.5 μm; specific surface area: 6.25 m$^2$/g)

(3) Coupling agent A (epoxy silane coupling agent; trade name: A-187, manufactured by Nippon Unicar Company Limited)

(4) Coupling agent B (amino phenyl silane coupling agent; trade name: KBM573, manufactured by Shin-Etsu Chemical Co., Ltd.)

(5) Coupling agent C (mercaptosilane coupling agent; trade name: KBM803, manufactured by Shin-Etsu Chemical Co., Ltd.)

(6) Epoxy resin (biphenyl dimethylene type epoxy resin; trade name: NC-3000, manufactured by Nippon Kayaku Co., Ltd.; epoxy equivalent: 275; weight-average molecular weight: 1,000)

(7) Phenoxy resin A (copolymer of biphenyl epoxy resin and bisphenol S epoxy resin, having epoxy group at terminal position; trade name: YX-8100H30, manufactured by Japan Epoxy Resins Co., Ltd.; weight-average molecular weight: 30,000)

(8) Phenoxy resin B (copolymer of bisphenol A type epoxy resin and bisphenol F type epoxy resin, having epoxy group at terminal position; trade name: jER4275, manufactured by Japan Epoxy Resins Co., Ltd.; weight-average molecular weight 60,000)

(9) Cyanate resin (novolac type cyanate resin; trade name: Primaset PT-30, manufactured by Lonza; weight-average molecular weight: 700)

(10) Curing catalyst (imidazole compound; trade name: CUREZOL 1B2PZ (1-benzyl-2-phenylimidazole), manufactured by SHIKOKU CHEMICALS CORPORATION)

Example 1

(1) Preparation of Resin Varnish 20 parts by weight of epoxy resin, 15 parts by weight of phenoxy resin A, 25 parts by weight of cyanate resin, and 0.05 parts by weight of curing catalyst were dissolved and dispersed in methyl ethyl ketone. Further, 40 parts by weight of inorganic filler A and 0.2 parts by weight of coupling agent A were added therein, and agitated for 10 minutes by means of a high speed agitator. Thus, a resin varnish having a solid content of 50 weight % was prepared.

(2) Production of Insulating Sheet on a Base

The resin varnish obtained above was applied on one side of PET (polyethylene terephthalate) film having a thickness of 25 μm by means of a comma coater so as to form an insulation film having a thickness of 60 μm after drying. Then, the pet film was dried for 10 minutes at 160° C. by means of a drying machine. Thus, an insulating sheet provided on a base was produced.

(3) Production of Multilayer Printed Wiring Board 1

The insulating sheet on the base obtained above was layered on each side of the inner layer circuit board, on both surfaces of which a predetermined inner layer circuit was formed, so that insulating sheet side faces the inner layer circuit board, and then subjected to hot press molding under vacuum at 100° C. and 1 MPa by means of a vacuum pressurized laminating device. Thereafter, heat-curing was carried out for 60 minutes at 170° C. by means of a hot air drying machine.

The inner layer circuit board used was as follows:
insulating layer (halogen free; FR-4 material; thickness: 0.4 mm); and
conducting layer (thickness of copper foil: 18 μm; L/S: 120/180 μm; clearance hole: 1 mmϕ, 3 mmϕ; slit: 2 mm).

(4) Production of Multilayer Printed Wiring Board 2

The base was peeled from the multilayer printed wiring board 1 obtained above. Such a board was dipped in a swelling agent (trade name: Swelling Dip Securiganth P, manufactured by Atotech Japan K.K.) having a temperature of 70° C. for 10 minutes, further dipped in a potassium permanganate aqueous solution (trade name: Concentrate Compact CP, manufactured by Atotech Japan K.K.) having a temperature of 80° C. for 20 minutes, and then neutralized to allow roughening treatment. Then, the surface roughness of the board was measured by means of WYKO NT1100 (trade name, manufactured by Veeco). The Rvk was 0.33 μm.

After degreasing, providing catalyst and activation, an electroless copper plating film having a thickness of about 1 μm, and electroplating copper having a thickness of 30 μm were formed on the board. Then, annealing treatment was carried out at 200° C. for 60 minutes by means of a hot air drying machine. Thus, a multilayer printed wiring board was obtained.

Example 2

15 parts by weight of epoxy resin, 20 parts by weight of phenoxy resin B, 25 parts by weight of cyanate resin and 0.05 parts by weight of curing catalyst were dissolved and dispersed in methyl ethyl ketone. Further, 40 parts by weight of inorganic filler A and 0.2 parts by weight of coupling agent B were added therein, and agitated for 10 minutes by means of a high speed agitator. Thus, a resin varnish having a solid content of 50 weight % was prepared.

Using the resin varnish, an insulating sheet on a base and multilayer printed wiring boards 1 and 2 were obtained in the same manner as Example 1. The surface roughness Rvk after the roughening treatment was 0.25 μm.

Example 3

20 parts by weight of epoxy resin, 20 parts by weight of phenoxy resin A, 35 parts by weight of cyanate resin and 0.05 parts by weight of curing catalyst were dissolved and dispersed in methyl ethyl ketone. Further, 25 parts by weight of inorganic filler A and 0.2 parts by weight of coupling agent C were added therein and agitated for 10 minutes by means of a high speed agitator. Thus, a resin varnish having a solid content of 50 weight % was prepared.

Using the resin varnish, an insulating sheet on a base and multilayer printed wiring boards 1 and 2 were obtained in the same manner as Example 1. The surface roughness Rvk after the roughening treatment was 0.35 μm.

Example 4

15 parts by weight of epoxy resin, 15 parts by weight of phenoxy resin B, 20 parts by weight of cyanate resin and 0.2 parts by weight of curing catalyst were dissolved and dispersed in methyl ethyl ketone. Further, 50 parts by weight of inorganic filler A and 0.2 parts by weight of coupling agent A were added therein and agitated for 10 minutes by means of a high speed agitator. Thus, a resin varnish having a solid content of 50 weight % was prepared.

Using the resin varnish, an insulating sheet on a base and multilayer printed wiring boards 1 and 2 were obtained in the same manner as Example 1. The surface roughness Rvk after the roughening treatment was 0.55 μm.

Example 5

10 parts by weight of epoxy resin, 5 parts by weight of phenoxy resin B, 10 parts by weight of cyanate resin and 0.05 parts by weight of curing catalyst were dissolved and dispersed in methyl ethyl ketone. Further, 50 parts by weight of inorganic filler A and 0.2 parts by weight of coupling agent A were added therein and agitated for 10 minutes by means of a high speed agitator. Thus, a resin varnish having a solid content of 50 weight % was prepared.

Using the resin varnish, an insulating sheet on a base and multilayer printed wiring boards 1 and 2 were obtained in the same manner as Example 1. The surface roughness Rvk after the roughening treatment was 0.75 μm.

Comparative Example 1

25 parts by weight of epoxy resin, 10 parts by weight of phenoxy resin A, 25 parts by weight of cyanate resin and 0.05 parts by weight of curing catalyst were dissolved and dispersed in methyl ethyl ketone. Further, 40 parts by weight of inorganic filler B and 0.2 parts by weight of coupling agent A were added therein and agitated for 10 minutes by means of a high speed agitator. Thus, a resin varnish having a solid content of 50 weight % was prepared.

Using the resin varnish, an insulating sheet on a base and multilayer printed wiring boards 1 and 2 were obtained in the same manner as Example 1. The surface roughness Rvk after the roughening treatment was 0.95 μm.

Comparative Example 2

20 parts by weight of epoxy resin, 30 parts by weight of phenoxy resin B, 40 parts by weight of cyanate resin and 0.05 parts by weight of curing catalyst were dissolved and dispersed in the methyl ethyl ketone. Further, 10 parts by weight of inorganic filler A and 0.2 parts by weight of coupling agent were added therein and agitated for 10 minutes by means of high speed agitator. Thus, a resin varnish having a solid content of 50 weight % was prepared.

Using the resin varnish, an insulating sheet on a base and multilayer printed wiring boards 1 and 2 were obtained in the same manner as Example 1. The surface roughness Rvk after the roughening treatment was 0.05 μm.

Comparative Example 3

5 parts by weight of epoxy resin, 5 parts by weight of phenoxy resin A, 15 parts by weight of cyanate resin and 0.05 parts by weight of curing catalyst were dissolved and dispersed in methyl ethyl ketone. Further, 75 parts by weight of inorganic filler A and 0.2 parts by weight of coupling agent were added therein and agitated for 10 minutes by means of a high speed agitator. Thus, a resin varnish having a solid content of 50 weight % was prepared.

Using the resin varnish, an insulating sheet on a base and multilayer printed wiring boards 1 and 2 were obtained in the same manner as Example 1. The surface roughness Rvk after the roughening treatment was 1.15 μm.

The properties were evaluated for the insulating sheets on the base and the multilayer printed wiring boards obtained by Examples and Comparative examples. The results are shown in Table 1.

TABLE 1

| | | Example 1 | Example 2 | Example 3 | Example 4 | Example 5 | Comparative Example 1 | Comparative Example 2 | Comparative Example 3 |
|---|---|---|---|---|---|---|---|---|---|
| Inorganic filler | A (SO-C1) | 40 | 40 | 25 | 50 | 75 | | 10 | 85 |
| | B (SO-25R) | | | | | | 40 | | |
| Coupling agent | A (A-187) | 0.2 | | | 0.2 | 0.5 | 0.2 | 0.2 | 0.2 |
| | B (KBM573) | | 0.2 | | | | | | |
| | C (KBM803) | | | 0.2 | | | | | |
| Epoxy resin | NC3000 | 20 | 15 | 20 | 15 | 10 | 25 | 20 | 6 |
| Phenoxy resin | A (YX8100H30) | 15 | | 20 | | | 10 | | 3 |
| | B (jER4275) | | 20 | | 15 | 5 | | 30 | |
| Cyanate resin | Primaset PT-30 | 25 | 25 | 35 | 20 | 10 | 25 | 40 | 6 |
| Curing accelerator | 1B2PZ | 0.05 | 0.05 | 0.05 | 0.2 | 0.05 | 0.05 | 0.05 | 0.05 |
| Total | | 100.25 | 100.25 | 100.25 | 100.25 | 100.55 | 100.25 | 100.25 | 100.25 |
| Surface roughness | Rvk (μm) | 0.33 | 0.25 | 0.35 | 0.55 | 0.70 | 0.95 | 0.05 | 1.15 |
| Peeling strength of plating | kgf/cm | 0.70 | 0.80 | 0.75 | 0.65 | 0.55 | 0.80 | 0.25 | 0.20 |
| Swelling of plating | | ○ | ○ | ○ | ○ | ○ | ○ | × | × |
| Hygroscopic solder heat resistance | | ○ | ○ | ○ | ○ | ○ | × | × | × |

Evaluation methods are as follows.

(1) Peeling Strength of Plating

Peeling strength of copper plating of each multilayer printed wiring board 2 was measured with reference to JIS C-6481-1996.

(2) Swelling of Plating

For examples in which no swelling was observed in any of the processes including electroless copper plating, electroplating of copper and annealing treatment when producing the multilayer printed wiring board 2, "○" is shown. For examples in which swelling was observed in one of the above processes when producing the multilayer printed wiring board 2, "×" is shown.

(3) Hygroscopic Solder Heat Resistance

A sample having a size of 50 mm×50 mm was taken from each multilayer printed wiring board 2. All copper foil on one side of the sample and a half of the copper foil on the other side of the sample were removed by etching. After processing the sample in a pressure cooker at 125° C. for 2 hours, the sample was placed with the copper foil surface side down in a solder bath having a temperature of 260° C. for 180 seconds, and then presence of swelling and peeling was observed. For examples in which no swelling and no peeling were observed, "○" is shown. For examples in which swelling or peeling was observed, "×" is shown.

Examples 1 to 5 show the resin compositions of the present invention, in which the surface roughness Rvk of the insulating layer is from 0.1 μm to 0.8 μm measured after the roughening treatment, the insulating sheets on the base, and the multilayer printed wiring boards using the resin composition.

In examples 1 to 5, hygroscopic solder heat resistance and peeling strength of the plated metal were excellent, and the swelling of plating was not observed.

Comparative examples 1 to 3 had problems in peeling strength of plating, swelling of plating and hygroscopic solder heat resistance since the surface roughness Rvk after the roughening treatment was more than 0.8 μm or less than 0.1 μm.

The invention claimed is:

1. A resin composition used for forming an insulating layer of a multilayer printed wiring board, comprising an inorganic filler having an average particle diameter from 0.01 μm to 0.45 μm and present in an amount from 30 weight % to 75 weight %, an epoxy resin having a weight-average molecular weight of 5,000 or less and present in an amount from 10 weight % to 40 weight %, and a phenoxy resin having a weight-average molecular weight from 10,000 to 70,000, wherein the resin composition has a property to be cured by heating to form a layer having a thickness of 10 to 100 μm, the layer having a surface roughness parameter Rvk value from 0.1 μm to 0.8 μm, measured after roughening treatment in which the layer is dipped in a swelling agent made of an aqueous solution containing 20 to 60 wt % of dimethylene glycol monobutyl ether and 0.1 to 1.0 wt % of sodium hydrate and having a temperature from 50 to 90° C. for 3 to 20 minutes, and then the layer is dipped in a roughening agent made of an aqueous solution containing 5.0 to 15.0 wt % of permanganate and 1.0 to 10.0 wt % of sodium hydrate and having a temperature from 60 to 90° C. for 3 to 40 minutes.

2. The resin composition according to claim 1, wherein a specific surface area of the inorganic filler is from 8 $m^2/g$ to 200 $m^2/g$.

3. The resin composition according to claim 1, wherein the inorganic filler is a spherical silica.

4. The resin composition according to claim 1, comprising one or more kinds of silane coupling agents selected from an epoxy silane coupling agent, an amino phenyl silane coupling agent, an amino silane coupling agent, a mercaptosilane coupling agent and a vinyl silane coupling agent.

5. The resin composition according to claim 1, further comprising a cyanate resin and/or a prepolymer thereof.

6. The resin composition according to claim 1, further comprising an imidazole compound as a curing accelerator.

7. An insulating sheet provided on a base, wherein a resin composition defined by claim 1 is carried on the base.

8. A prepreg comprising a fiber base material impregnated with a resin composition defined by claim 1.

9. A multilayer printed wiring board comprising an inner layer circuit board and an insulating layer, wherein the insulating layer is provided on one side or both sides of the inner layer circuit board, and the insulating layer is made of a cured product of a resin composition defined by claim 1.

10. The multilayer printed wiring board according to claim 9, wherein a surface roughness parameter Rvk value of the insulating layer is from 0.1 μm to 0.8 μm.

11. A semiconductor device comprising a multilayer printed wiring board defined by claim 9 used as a substrate for a package.

12. A multilayer printed wiring board comprising an inner layer circuit board and an insulating layer, wherein the insulating layer is provided on one side or both sides of the inner layer circuit board, and the insulating layer is made of a cured product of a prepreg, which is a fiber base material impregnated with a resin composition defined by claim 1.

13. The multilayer printed wiring board according to claim 12, wherein a surface roughness parameter Rvk value of the insulating layer is from 0.1 μm to 0.8 μm.

14. A semiconductor device comprising a multilayer printed wiring board defined by claim 12 used as a substrate for a package.

* * * * *